United States Patent
Aihara

[11] Patent Number: 5,986,311
[45] Date of Patent: Nov. 16, 1999

[54] SEMICONDUCTOR DEVICE HAVING RECRYSTALLIZED SOURCE/DRAIN REGIONS

[75] Inventor: Katsuyoshi Aihara, Kamifukuoka, Japan

[73] Assignee: Citizen Watch Company, Ltd., Tokyo, Japan

[21] Appl. No.: 08/864,877

[22] Filed: May 19, 1997

[51] Int. Cl.[6] .............................. H01L 29/04; H01L 29/43
[52] U.S. Cl. ........................ 257/382; 257/66; 257/75; 257/347
[58] Field of Search .................... 257/382, 347, 257/66, 75, 51

[56] References Cited

U.S. PATENT DOCUMENTS

| 4,826,782 | 5/1989 | Sachitano et al. | 257/382 X |
| 5,729,039 | 3/1998 | Beyer et al. | 257/347 |
| 5,736,770 | 4/1998 | Asai et al. | 257/382 |
| 5,780,896 | 7/1998 | Ono | 257/344 |

OTHER PUBLICATIONS

C. Carter et al.; Appl. Phys. Lett. vol. 44 No. 4; pp. 459–461, Feb. 15, 1994.

*Primary Examiner*—John Guay
*Attorney, Agent, or Firm*—Armstrong, Westerman, Hattori, McLeland & Naughton

[57] ABSTRACT

A gate oxide film is formed on a thin-film SOI substrate or on a single crystalline silicon substrate and a gate is formed on the gate oxide film. The surfaces of a single crystalline silicon at diffusion layer regions on opposite sides of the gate are cleaned and an amorphous silicon film is formed thereon and on the side walls of the gate. Impurity ions are implanted in the amorphous silicon film, which is then converted into recrystallized silicon films by annealing. An interlayer insulator film is formed and another annealing is conducted. As a result, impurity ions in the recrystallized silicon films diffuse into the diffusion layer region of the single crystalline silicon and are activated to form a source and a drain.

3 Claims, 13 Drawing Sheets

SEMICONDUCTOR DEVICE HAVING RECRYSTALLIZED SOURCE/DRAIN REGIONS

BACKGROUND OF THE INVENTION

1. Field of the Invention

This invention relates to the structure of a field effect transistor (FET), an integrated circuit (IC) formed by integrating FETs on a single substrate, or other such semiconductor device, and to a method of fabricating a semiconductor device of such structure.

2. Description of the Related Art

Recent years have seen the use of semiconductor devices employing silicon-on-insulator (SOI) structure as high-voltage devices and high-speed devices. Particularly in the area of thin-film SOI, research is being conducted toward optimizing reduction of power consumption and enhancement of current driving characteristics.

The formation of the diffusion layer of the thin-film (SOI) structure will be explained first with reference to the sectional view in FIG. 33.

A gate oxide film 2 is formed on a SIMOX (separation-by-implantation-of-oxygen) substrate 20 having a buried oxide layer 19 sandwiched between a single crystalline silicon substrate 1 and an active region 18.

The SIMOX substrate 20 is formed by using an ion implantation method to implant oxygen ions into the single crystalline silicon substrate 1 from the surface thereof, forming the buried oxide layer 19 (a silicon oxide layer) in the interior of the single crystalline silicon substrate 1 by an ensuing annealing, and forming the active region 18 near the surface.

The implanted oxide layer 19 has a thickness of about 80 nm and the active region 18 a thickness of about 150 nm.

The gate oxide film 2 is formed, a gate 4 (a polysilicon film) is formed thereon, an mask oxide film 5 is formed on the surface of the gate 4, and impurity ions are implanted into the entire surface by an ion implantation method.

An interlayer insulator film (not shown) is formed on the SIMOX substrate 20. The result is annealed in an inert gas to diffuse the implanted impurity ions into diffusion layer regions 15, 15 (the active region 18) on opposite sides of the gate 4, simultaneously activating the impurity ions to form a source and a drain.

Since ion implantation injects energized impurity ions through the crystal of the host material, it generally causes dislocations in the crystal structure.

In the ordinary structure for forming a device in the single crystalline silicon substrate 1, the thickness of the single crystalline silicon substrate 1 corresponds to the thickness of the active region 18 of the SOI structure. Because of this, not all of the crystals in the thickness direction are dislocated and damaged by the ion implantation.

The annealing for impurity diffusion and activation after interlayer insulator film formation therefore enables the crystals dislocated during ion implantation to recover easily using the undislocated crystals as seeds.

In the SOI structure, on the other hand, all of the active region 18 of the buried oxide layer 19 formed by ion implantation is amorphous. The crystal grains therefore enlarge but do not become single crystal owing to the annealing after formation of the interlayer insulator film.

In other words, when a device is formed on the single crystalline silicon substrate 1, seed crystals enabling crystal recovery are present after ion implantation but are not present in the case of the thin-film SOI structure because the active region 18 is amorphized throughout.

Thus when the diffusion layer region 15 is formed in the thin-film SOI structure by the conventional method, the active region 18 is thin, so that it exhibits high sheet resistance, and is amorphized by the ion implantation. This results in a great increase in the contact resistance of the source and drain formed in the diffusion layer regions 15, 15 of the active region 18.

This phenomenon arises both in the case of implanting P-type impurity ions and in the case of implanting N-type impurity ions.

In a thin-film (SOI) structure semiconductor device, therefore, contact resistance is reduced by forming a refractory metal material or a silicide thereof in the diffusion layer region. Since this involves use of a different type of material, however, the compatibility of the process is poor.

The formation of the diffusion layer of a P-type conductivity field effect transistor (FET) formed on a single crystalline silicon substrate will now be explained.

In the prior art, the P-type diffusion layer region to constitute the diffusion layer region of the P-type conductivity FET is obtained by ion implantation of boron ($^{11}B^+$).

As FET geometry is scaled down to the sub-micron range, however, the diffusion layer for constituting the source and drain has to be made increasingly shallow. The formation of the required shallow diffusion layer by boron ion implantation has become difficult.

This is because boron, being a light element, has a large implantation range, and this, plus the effect of channeling, makes it hard to obtain a shallow diffusion layer.

Channeling refers to the deep penetration of ions into the crystal without significant scattering when the direction of ion incidence coincides with the direction of the voids enclosed by rows of atoms on the side of the single crystalline silicon substrate to be implanted.

Another problem of boron is that its large diffusion coefficient during annealing promotes the occurrence of secondary diffusion and hinders the formation of a shallow diffusion layer.

Although a shallow diffusion layer can be formed by reducing the boron implantation energy, lowering the acceleration energy enlarges the channeling critical angle and makes it impossible to suppress channeling at the conventional implantation angle of around 6–7 degrees.

Another method proposed for reducing implantation depth is to implant boron fluoride ($^{49}BF_2^+$), which has a large mass number, in place of boron.

It is known that a larger beam current can be secured with boron fluoride ($^{49}BF_2^+$) than with boron ($^{11}B^+$) and that, therefore, the implantation depth is about one fourth that of boron ($^{11}B^+$) for the same acceleration energy. In effect, this enables low acceleration energy implantation.

When boron fluoride ($^{49}BF_2^+$) is used and the annealing temperature is 900° C. or lower, however, the ion-implanted fluorine remains in the silicon substrate. Since these fluorine ions remain at lattice defects and dislocation in the single crystalline silicon substrate, they obstruct recovery of the silicon crystallinity and affect the transistor characteristics since they are a cause of leak current occurring at the pn junctions and the like.

In addition, channeling occurring during ion implantation of boron fluoride ($^{49}BF_2^+$) hinders formation of a shallow P-type diffusion layer.

An example of a prior-art technique currently used to suppress channeling in boron implantation will be explained with reference to the sectional view of FIG. 34.

As shown in FIG. 34, there can be used a single crystalline silicon substrate 1 of N-type conductivity or, instead, a single crystalline silicon substrate obtained by implanting N-type impurity ions in a single crystalline silicon substrate 1 and annealing it to form a diffused N-type conductivity region called an N-well.

A gate oxide film 2 and a gate 4 are formed on the single crystalline silicon substrate 1. Next, the surface of the diffusion layer region 15 is implanted with silicon ions using the photoresist 16 used for forming the gate 4 as an ion implantation mask.

This silicon ion implantation forms an amorphous film 14 with an irregular crystal lattice on the surface of the diffusion layer region 15 of the single crystalline silicon substrate 1. The photoresist 16 is then removed and P-type conductivity impurity ions are implanted in the diffusion layer region 15 by self-alignment relative to the gate 4.

The amorphous film 14 having the irregularly positioned crystal lattice suppresses occurrence of channeling and the impurity ions are implanted in a shallow depth region of the diffusion layer region 15 of the single crystalline silicon substrate 1.

Next, impurity activation and recrystallization of the amorphous layer 14 are effected by annealing in an inert gas to obtain a shallow diffusion layer constituting a source 11 and drain 12 compatible with FET geometry scaled down to the sub-micron range.

In the semiconductor device explained with reference to FIG. 34, the diffusion layer region 15 constituting the source and drain is obtained as a shallow diffusion layer. Since the silicon ions of certain energy damage the surface of the single crystalline silicon substrate 1 at the diffusion layer region 15, however, secondary defects and the like occur in the vicinity of the interface between the amorphous film 14 and the single crystalline silicon substrate 1 even after annealing. These defects prevent complete recovery of crystallinity.

Owing to this failure to secure perfect crystallinity, the breakdown voltage of the pn junctions formed between the single crystalline silicon substrate 1, or the N-type conductivity region called an N-well formed in the single crystalline silicon substrate 1, and the diffusion layer region 15 is degraded to increase the leak current across the junctions. This is discussed, for example, by C. Carter et al. in Appl. Phys. Lett., Vol 44, No. 4, Feb. 15, 1984, PP. 459–461.

As explained in the foregoing, the prior-art fabrication method cannot easily form the diffusion layer of a field effect transistor according to the thin-film SOI structure so as to be free of crystal defects and low in resistance. It is also incapable of easily forming the shallow P-type conductivity diffusion layer for constituting the source and drain of a small-geometry FET formed on a single crystalline silicon substrate so as to be free of crystal defects and exhibit good reproducibility.

SUMMARY OF THE INVENTION

The object of this invention is to overcome these problems so as to enable the diffusion layer to constitute the source and drain of a field effect transistor according to the thin-film SOI structure to be formed free of crystal defects and with low resistance and, further, to enable a shallow P-type conductivity diffusion layer of a small-geometry field effect transistor formed on a single crystalline silicon substrate to be formed free of crystal defects and with good reproducibility. The invention provides a semiconductor device and a method of fabricating the same which achieve these objects.

The semiconductor device according to the invention comprises a gate oxide film formed on an SOI substrate or a conductivity type region of a single crystalline silicon substrate, a gate formed on the gate oxide film, a mask oxide film formed on the sides and the top surface of the gate, recrystallized silicon films formed on the mask oxide film at the sides of the gate and on the substrate or the conductivity type region at diffusion layer regions on opposite sides of the gate, and a source and a drain formed on opposite sides of the gate by the recrystallized silicon films on the diffusion layer regions and the diffusion layer into which impurity ions have diffused therefrom.

The method of fabricating a semiconductor device according to the invention comprises:

a step of successively forming a gate oxide film and a polysilicon film on a conductivity type region of an SOI substrate or a single crystalline silicon substrate, a step of patterning the polysilicon film to form a gate electrode, a step of forming a mask oxide film on the surface of the gate, a step of removing the mask oxide film formed at regions other than the top and sides of the gate, a step of subjecting surfaces of the single crystalline silicon substrate at diffusion layer regions destined to become a source and a drain to cleaning in a gas phase, a step, continuously following the preceding step, of forming an amorphous silicon film on the whole surface of the substrate and the gate, a step of implanting impurity ions in the amorphous silicon film, a step of thereafter converting the amorphous silicon film at the diffusion layer regions and the side walls of the gate to recrystallized silicon films by subjecting the substrate formed with the gate and the different layers to first annealing in an inert gas, a step of removing the amorphous silicon film from the top of the gate, a step of forming a source and a drain by forming an interlayer insulator film on the whole surface of the substrate having passed through the foregoing steps and conducting a second annealing in an inert gas to diffuse impurity ions in the recrystallized silicon films into the single crystal silicon of the diffusion layer regions, a step of forming contact holes at locations of the interlayer insulator film corresponding to the source and the drain, and a step of forming interconnections through the contact holes to the source and the drain.

The above and other objects, features and advantages of the invention will be apparent from the following detailed description which is to be read in conjunction with the accompanying drawings.

DETAILED DESCRIPTION OF THE PREFERRED EMBODIMENTS

Embodiments of the invention will now be explained with reference to the drawings.

Figure 1:
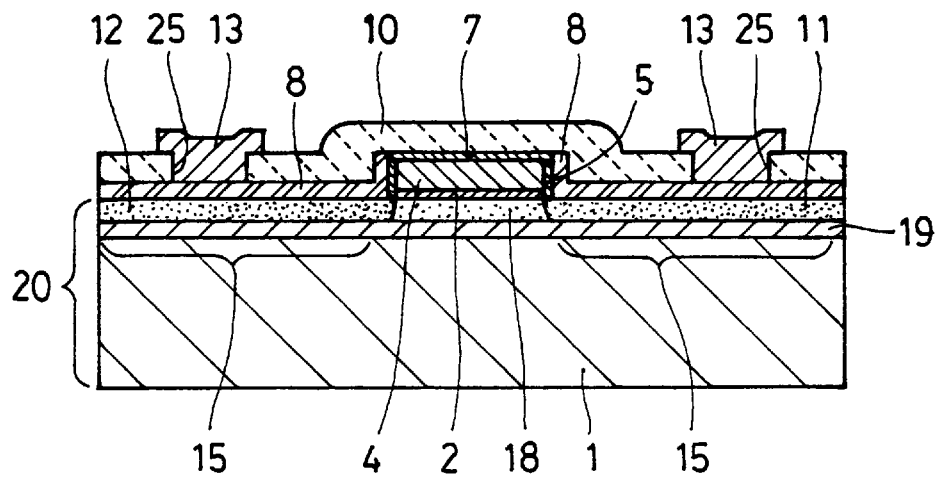
FIG. 1 is a sectional view showing the structure of a semiconductor device which is a first embodiment of the invention.

First Embodiment of Semiconductor Device: FIG. 1

A semiconductor device which is a first embodiment of the invention will now be described with reference to the sectional view of FIG. 1.

This semiconductor device is a field effect transistor (FET) fabricated using as the SOI structure substrate a SIMOX (separation-by-implantation-of-oxygen) substrate 20 comprising a single crystalline silicon substrate 1 having an buried oxide layer 19 formed thereon to a thickness of 80 nm and an N-type active region 18 of a resistivity of 8–12 Ω·cm formed to a thickness of 150 nm on the buried oxide layer 19.

A gate oxide film 2 and a gate 4 constituted as a polysilicon film are provided on the surface of the active region 18. A first mask oxide film 5 and a second mask oxide film 7 are formed to enclose the gate 4. Recrystallized silicon films 8 are provided on diffusion layer regions 15, 15 on opposite sides of the gate 4 and on the first mask oxide film 5 at the sides of the gate 4.

The recrystallized silicon films 8 are implanted with N-type impurity ions which diffuse into the active region 18 in the diffusion layer regions 15, 15 during annealing and are simultaneously activated to form the source 11 and the drain 12 of the field effect transistor.

The recrystallized silicon films 8 are covered on top with an interlayer insulator film 10 constituted as a silicon oxide film containing boron and phosphorus (BPSG: boron phosphorus silicate glass) and formed with contact holes 25, 25 at locations corresponding to the source 11 and the drain 12 of the interlayer insulator film 10. Aluminum interconnections 13, 13 pass through the contact holes 25, 25 and connect to the source 11 and the drain 12.

The semiconductor device of this structure according to the invention differs from the semiconductor device of the conventional SOI structure in the point that the recrystallized silicon films 8 are provided on the diffusion layer regions 15, 15 and the sides of the gate 4.

By this, the diffusion layer regions 15, 15 are amorphized before implantation of impurity ions, the diffusion layer is formed by the ensuing recrystallization, and the contact resistance that the source 11 and drain 12 formed in these diffusion layer regions 15, 15 make with the interconnections 13, 13 connected therewith is reduced. In this embodiment of the semiconductor device, therefore, the contact resistance with the aluminum interconnections 13, 13 is low even though a treatment to degrade the resistance such as forming refractory metal or its silicide compound on the source 11 and drain 12 is not conducted.

First Embodiment of Fabrication Method: FIGS. 1 to 16

The method of fabricating the semiconductor device shown in FIG. 1 will now be explained with reference to FIGS. 2 to 16 and FIG. 1. The semiconductor device shown in FIG. 1 is actually configured as a complementary field effect transistor (CMOS FET). In the interest of simplifying the explanation, however, the configuration shown is that of a single field effect transistor of N-type conductivity.

Figure 2:
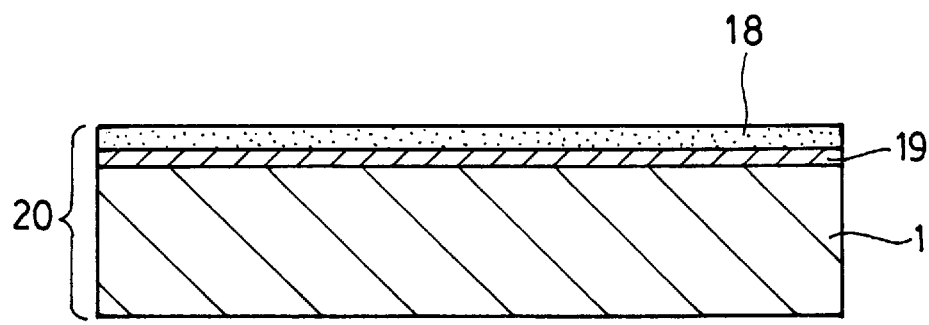
FIGS. 2 to 16 are sectional views showing processing steps for explaining the method of the invention for fabricating the semiconductor device shown in FIG. 1.

The fabrication of this semiconductor device starts with the preparation of an SOI structure substrate by, as shown in FIG. 2, preparing a SIMOX substrate 20 comprising a single crystalline silicon substrate 1 having a buried oxide layer 19 formed thereon to a thickness of 80 nm and an N-type active region 18 of a resistivity of 8–12 Ω·cm formed to a thickness of 150 nm on the buried oxide layer 19.

This SIMOX substrate 20 is formed by ion injecting the whole surface of the single crystalline silicon substrate 1 with oxygen ions under conditions of an ion implantation dose of $4 \times 10^{17}$ atoms/cm$^2$ and an acceleration energy of 120 Kev and then subjecting the ion-implanted single crystalline silicon substrate 1 to annealing at 1320° C. for 360 min.

The result is subjected to oxidation at 1000° C. in mixed oxygen and nitrogen gas using a thermal oxidation furnace to form a 10 nm gate oxide film 2 (FIG. 3) on the surface of the active region 18 of N-type conductivity of the SIMOX substrate 20.

Figure 3:
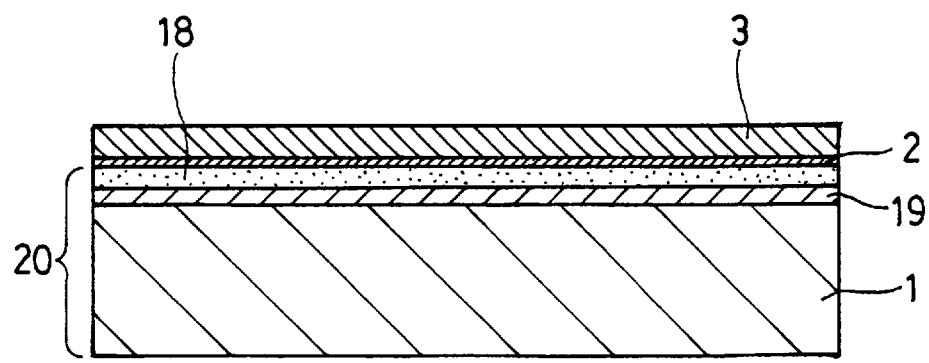

Next, a 300 nm polysilicon film 3 for constituting a gate is formed on the gate oxide film 2 as shown in FIG. 3 with a chemical vapor deposition (CVD) system using monosilane gas (SiH$_4$) as the reactive gas at 610° C., 0.3 Torr.

Figure 4:
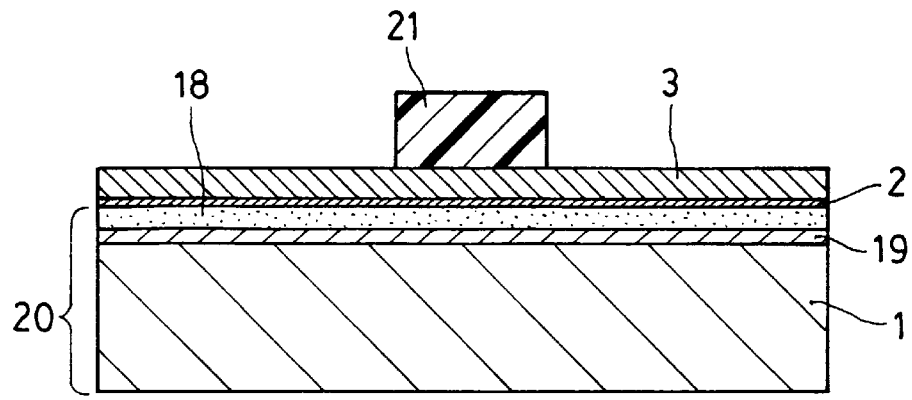

A photolithography is then used to form a photoresist 21 covering only the region of the polysilicon film 3 to become the gate, as shown in FIG. 4. Specifically, a photoresist formed over the whole surface by the spin coating method is exposed through a prescribed photomask and developed to obtain the desired pattern.

Figure 5:
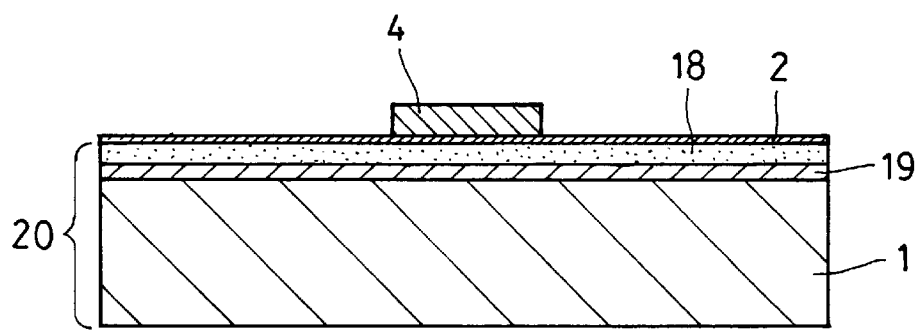

Using the photoresist 21 as an etching mask, the polysilicon film 3 is then etched with a mixed gas of Cl$_2$+SF$_6$+CH$_2$F$_2$ using ECR (electron cyclotron resonance) plasma to form a gate 4 with high precision, as shown in FIG. 5.

Figure 6:
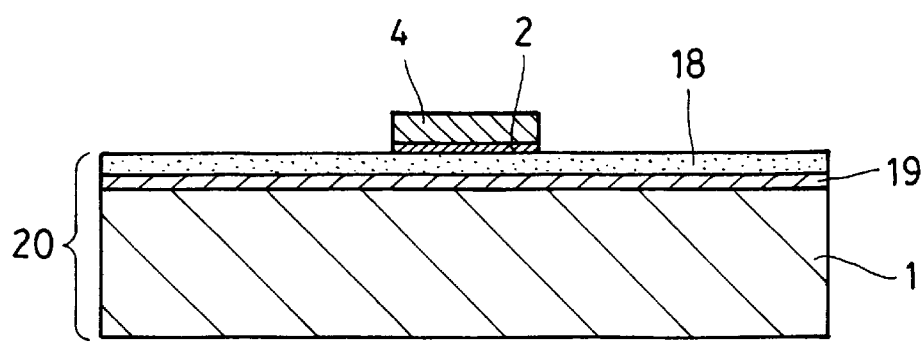

The gate oxide film 2 except for that under the gate 4 is removed by hydrofluoric acid, as shown in FIG. 6.

Figure 7:
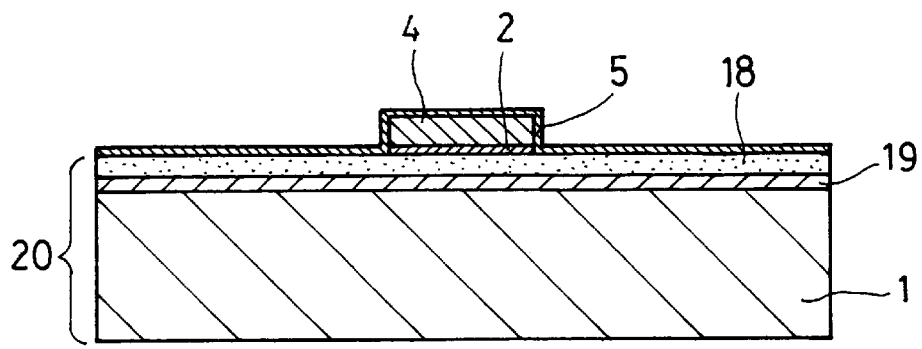

The result is subjected to oxidation treatment at 1000° C. in an atmosphere of mixed oxygen and nitrogen gas using a thermal oxidation furnace to form a 5 nm first mask oxide film 5 over the whole surface of the SIMOX substrate 20 including the surface of the gate 4, as shown in FIG. 7.

Figure 8:
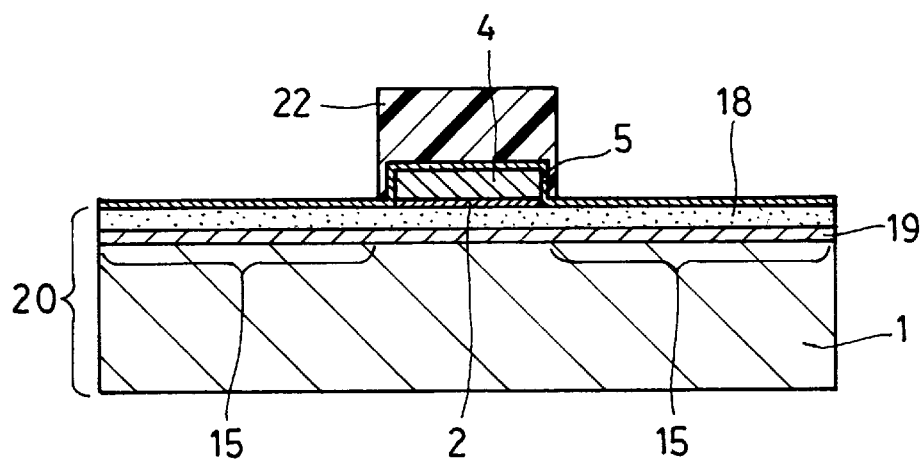
Figure 9:
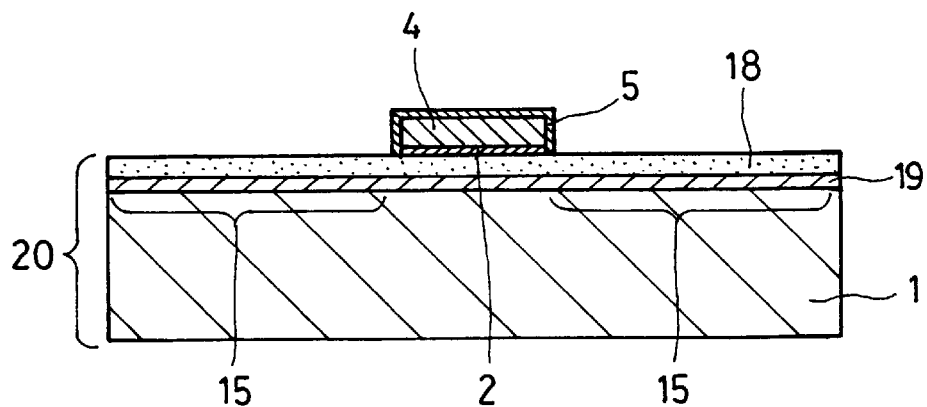

A photolithography is again used to pattern a photoresist 22 so as to expose the diffusion layer regions 15, 15 on opposite sides of the gate 4, as shown in FIG. 8. Using the patterned photoresist 22 as an etching mask, the first mask oxide film 5 on the diffusion layer regions 15, 15 is then removed by etching using a hydrofluoric acid, as shown in FIG. 9.

Using a low-pressure CVD system, the surface of the active region 18 of the single crystalline silicon substrate 1 constituting the diffusion layer regions 15, 15 is subjected to cleaning for about 10 min in a gas phase, e.g. hydrogen atmosphere, at a reduced pressure of $1 \times 10^{-5}$ Torr and a temperature of about 950° C., thereby removing the natural oxide film formed on the surface of the active region 18.

The cleaning of the surfaces of the diffusion layer regions 15, 15 by use of a low-pressure CVD system can otherwise be conducted by evacuating the vacuum pump of about $1\times10^{-5}$ Torr, introducing a mixed gas of chlorine and hydrogen, and conducting the cleaning at a pressure of 0.3 Torr and a temperature of 570° C. for about 10 min.

Figure 10:
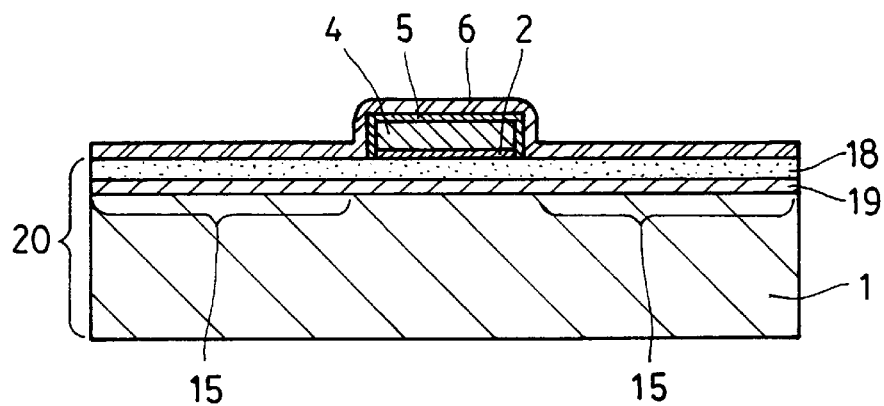

Continuously following this cleaning, the same CVD system is evacuated from the reduced-pressure state during the cleaning treatment to a vacuum state of about $1\times10^{-5}$ Torr and monosilane gas ($SiH_4$) at a temperature of 570° C. and a pressure of 0.3 Torr is used as a reactive gas for forming an amorphous silicon film 6 to a thickness of 150 nm, as shown in FIG. 10.

The whole surface of the amorphous silicon film 6 is next subjected to ion implantation using arsenic ($^{75}AS^+$) as N-type impurity ions, at an implantation energy of 40 keV and a dose of $1\times10^{15}$ atoms/cm$^2$. The implantation energy is controlled to implant the impurity ions only in the amorphous silicon film 6 and not in the diffusion layer regions 15, 15 of the single crystalline silicon substrate 1.

Similar implantation of impurity ions can also be implemented in the case of fabricating a P-type field effect thin-film transistor, specifically when implanting P-type impurity ions or changing the type of impurity ions, by selection of the thickness of the amorphous silicon film 6 and the acceleration energy of the impurity ions.

When fabricating a P-type field effect transistor, implantation of ions in the amorphous silicon film 6 can be conducted, for example, by implanting boron fluoride ($^{49}BF_2^+$) as P-type conductivity impurity ions at an implantation energy of 25 keV and a dose of $1\times10^{15}$ atoms/cm$^2$.

Figure 11:
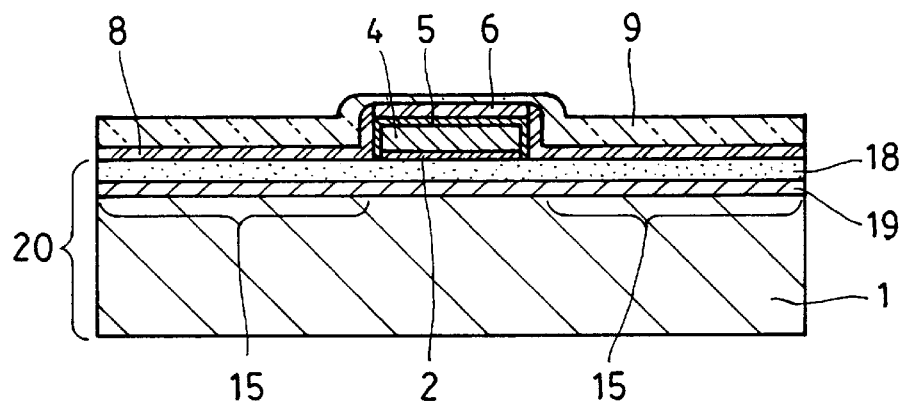

Next, annealing is conducted for two hours at 570° C. in an atmosphere of inert gas (nitrogen or argon) passed at a flow rate of 2000 cc/min to recrystallize the amorphous silicon film 6 and form the recrystallized silicon films 8 shown in FIG. 11.

The bond distances and bond angles between the silicon atoms of the amorphous silicon film 6 before annealing are in a disrupted state, while the diffusion layer regions 15, 15 constituting the active region 18 of the SIMOX substrate have the atomic arrangement of a crystal. When the annealing is conducted at this low temperature, the amorphous silicon film 6 uses the surfaces of the diffusion layer regions 15, 15 as seed crystals to grow into a continuous crystal film by shifting and realignment of grains at the interface between the amorphous silicon film 6 and the diffusion layer regions 15, 15. As a result, the amorphous silicon film 6 on the diffusion layer regions 15, 15 and the sides of the gate 4 converts into a single crystal silicon film by solid phase growth to become the recrystallized silicon films 8 shown in FIG. 11.

The first mask oxide film 5 is present on top of the gate 4 at the time of this recrystallization and the amorphous silicon film 6 is formed on the first mask oxide film 5. The amorphous silicon film 6 on top of the gate 4 is therefore not converted into a single crystal silicon film.

The spin coating method is used to form a coated insulator film 9 of spin-on glass (SOG) over the whole surface of the recrystallized silicon films 8 and the amorphous silicon film 6, as shown in FIG. 11. Spin-on glass, a phosphorous glass dissolved in a solvent, can be easily applied at room temperature. Owing to the fluidity of the spin-on glass, the thickness of the coated insulator film 9 becomes thick at the recessed portions. Specifically, as can be seen in FIG. 11, the coated insulator film 9 is thinner on the gate 4 than on the diffusion layer regions 15, 15.

Figure 12:
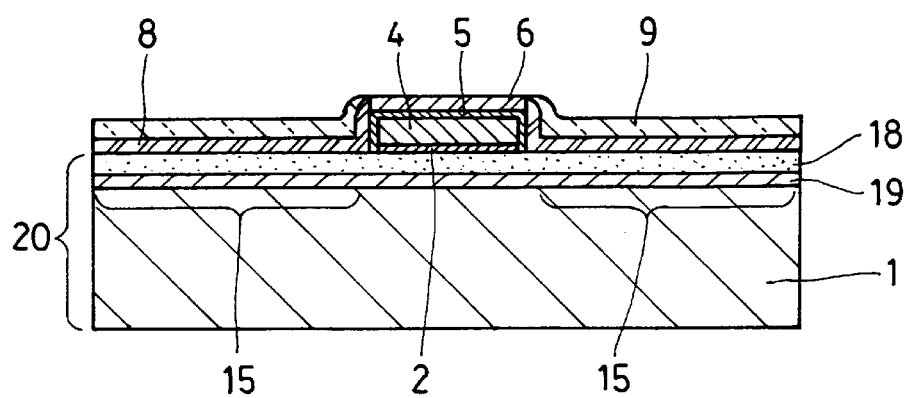

As shown in FIG. 12, the coated insulator film 9 on top of the gate 4 is removed by dry etching to expose the surface of the amorphous silicon film 6 on the gate 4.

Figure 13:
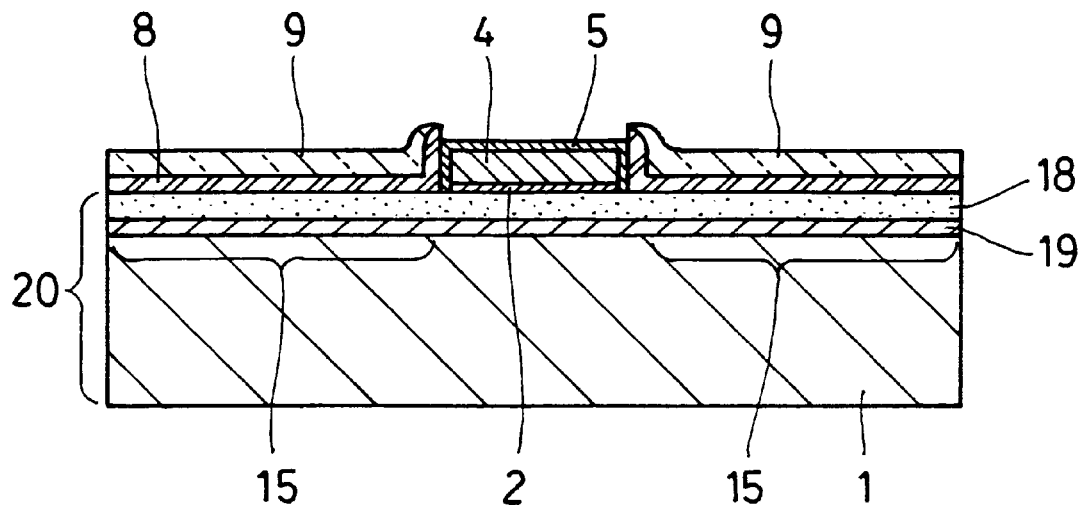

As shown in FIG. 13, the amorphous silicon film 6 on top of the gate 4 is removed by etching with a mixed hydrofluoric acid and nitric acid using the coated insulator film 9 remaining on the diffusion layer regions 15, 15 as an etching mask.

Figure 14:
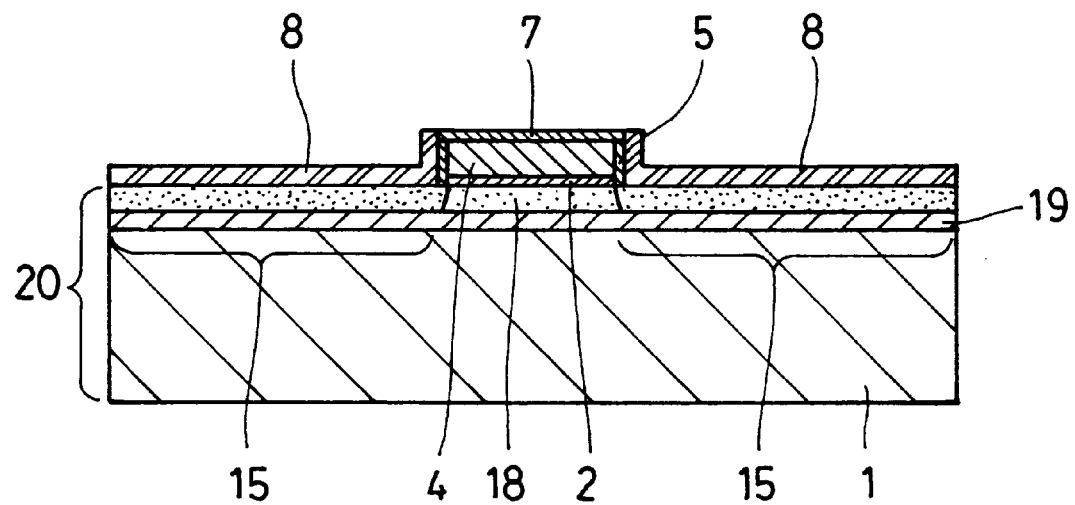
Figure 15:
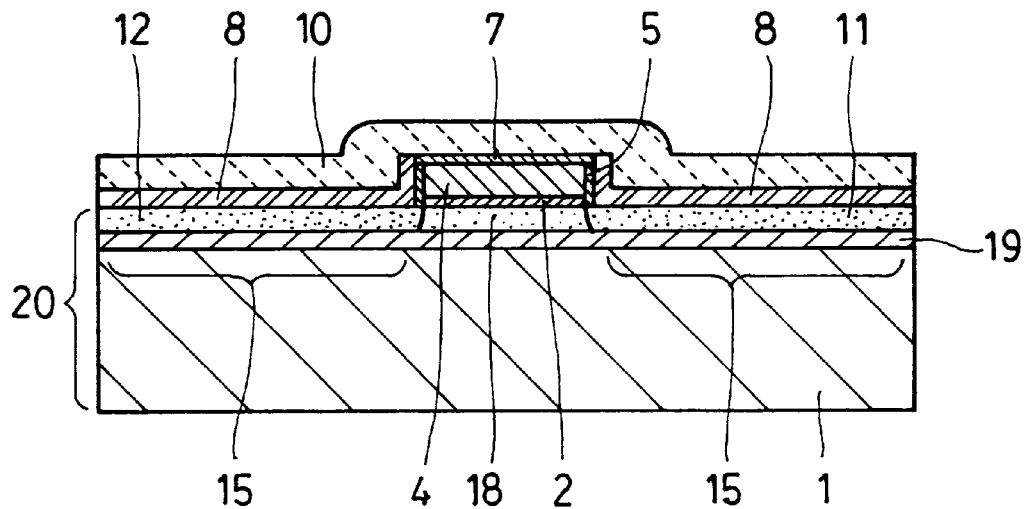

The coated insulator film 9 of SOG on the diffusion layer regions 15, 15 is then removed by etching as shown in FIG. 14 for the following reason.

Since the impurity contained in the coated insulator film 9 made of spin-on glass is of the opposite conductivity type from the P-type transistor, it is removed so as not to diffuse into, and alter the characteristics of, the transistor device.

While the explanation of this embodiment has been made with respect to the case of a field effect transistor of N-type conductivity, since a field effect transistor of P-type conductivity is also formed in the CMOS process, processing steps therefor were set out.

When the coated insulator film 9 is removed by etching, the first mask oxide film 5 on the gate 4 is also removed. As shown in FIG. 14, therefore, a 5 nm second mask oxide film 7 is formed on top of the gate 4 under the same oxidation conditions as used to form the first mask oxide film 5. Although the second mask oxide film is also formed on the recrystallized silicon films 8 converted from the amorphous silicon film 6 on the diffusion layer regions 15, 15, only the second mask oxide film 7 on the gate 4 is shown in the drawings.

The formation of the second mask oxide film 7 prevents impurities contained in the interlayer insulator film 10 to be formed in a later step from diffusing through the gate 4 to the gate oxide film 2 and altering the device characteristics.

The removal of the amorphous silicon film 6 from the top of the gate 4 can instead be effected by using a photolithography to coat all but the top of the gate 4 with a photoresist, followed by etching with a mixed hydrofluoric acid and nitric acid. In this case, since the first mask oxide film 5 is not removed, the second mask oxide film 7 need not be formed.

Next, a CVD method is carried out at 460° C. to coat the whole surface of the SIMOX substrate 20 formed with the gate 4, the recrystallized silicon films 8 and the like with an interlayer insulator film 10 consisting of a silicon oxide film containing phosphorous (P) and boron (B) (BPSG) to a thickness of 550 nm.

Annealing is then conducted in a nitrogen atmosphere at 925° C. for 10 min. This annealing causes the N-type impurity ions in the recrystallized silicon films 8 converted from the amorphous silicon film 6 to diffuse into the diffusion layer regions 15, 15 of the single crystalline silicon substrate 1 (active region 18). The impurity ions are activated simultaneously with this diffusion, thereby forming the source 11 and the drain 12 of the field effect transistor.

Figure 16:
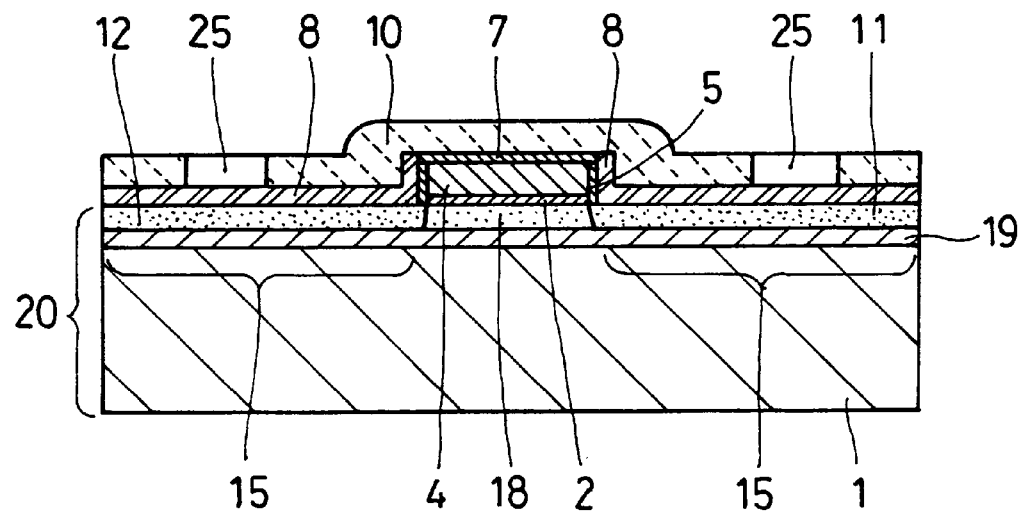

Contact holes 25, 25 are then formed in the interlayer insulator film 10 to open at the source 11 and the drain 12, as shown in FIG. 16.

Interconnections 13, 13 (FIG. 1) made of aluminum alloy are connected to the source 11 and the drain 12 through the contact holes 25, 25. This completes the semiconductor device shown in FIG. 1.

Since the recrystallized silicon films 8, which constitute single crystal silicon films, were converted from the amorphous silicon film 6 by annealing at 570° C., no step is required such as for implanting impurity ions of the same conductivity type as the diffusion layer in the contact hole regions of the source 11 and the drain 12 of the diffusion layer region 15 prior to forming the contact holes 25, 25.

The amorphous silicon film 6 need not be formed by a CVD method but can instead be formed by a sputtering method or the like. Cleaning of the top of the diffusion layer region 15 is also necessary in such case, however.

In this fabrication method, since the diffusion layer regions 15, 15 of the active region 18 are not amorphized by the implantation of the impurity ions and, moreover, since the diffusion layer region 15 is thick, the source 11 and the drain 12 do not increase in contact resistance but exhibit good contact property with the aluminum interconnections 13, 13.

While the embodiment explained in the foregoing uses a SIMOX substrate as the SOI substrate, an SOI substrate known as a direct wafer bonded substrate can be used instead.

The direct wafer bonded substrate is made by thermal-oxidation one of two silicon substrates to form a silicon oxide film on its surface, contacting the other silicon substrate with the one silicon oxide film, and heating the two wafers to bond them together. The thickness of the other silicon substrate is then reduced by mechanical polishing or by a combination of mechanical polishing and plasma processing to obtain an SOI substrate having an active region of desired thickness.

Figure 17:
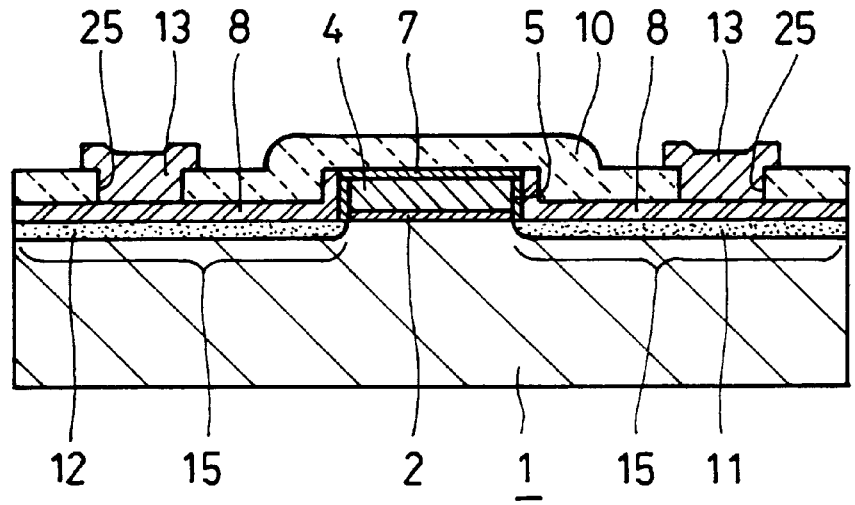
FIGS. 17 and 18 are sectional views showing another structure of a semiconductor device according to a second embodiment of the invention.
Figure 18:
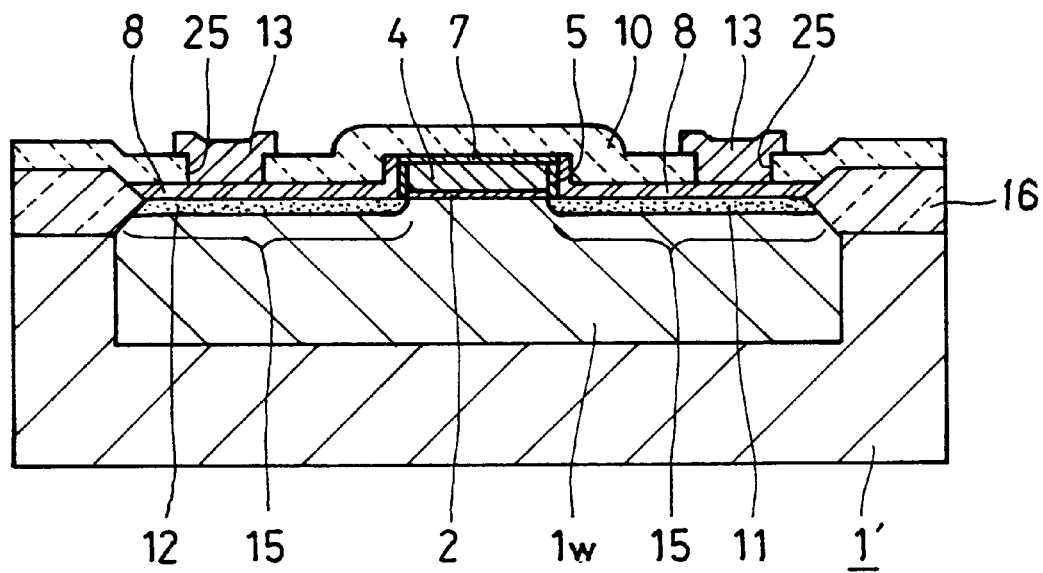

Second Embodiment of Semiconductor Device: FIGS. 17 and 18

A semiconductor device which is a second embodiment of the invention will now be described with reference to the sectional view of FIGS. 17 and 18. To facilitate the explanation, portions in these figures corresponding to portions in FIG. 1 are assigned the same reference symbols as those in FIG. 1.

As shown in FIG. 17, a gate oxide film 2 is provided on the surface of a single crystalline silicon substrate 1 of N-type conductivity (a conductivity type region throughout) and a gate 4 constituted as a polysilicon film is provided on the gate oxide film 2.

A first mask oxide film 5 is provided on the sides of the gate 4 and a second mask oxide film 7 is formed on the upper surface thereof. Recrystallized silicon films 8 are provided on the diffusion layer regions 15, 15 and on the first mask oxide film 5 on the sides of the gate 4.

The recrystallized silicon films 8 are implanted with P-type impurity ions which are diffused into the diffusion layer regions 15, 15 of the single crystalline silicon substrate 1 by annealing and activated to form the source 11 and the drain 12 of the field effect transistor.

The recrystallized silicon films 8 and the gate 4 are covered on top with the interlayer insulator film 10 consisting of a silicon oxide layer containing phosphorous (P) and boron (B) (BPSG) and formed with contact holes 25, 25 at locations corresponding to the source 11 and the drain 12. Aluminum interconnections 13, 13 pass through the contact holes 25, 25 and connect to the source 11 and the drain 12.

Alternatively, as shown in FIG. 18, it is possible to configure a semiconductor device by providing a conductivity type region 1w as an N-well in a single crystalline silicon substrate 1', form a device isolation insulator film 16 thereabout, and form films and electrodes similar to those of the semiconductor device shown in FIG. 17.

Both of these versions of the second embodiment differ structurally from the conventional semiconductor device of this type in the point that the recrystallized silicon films 8 are provided on the diffusion layer regions 15, 15 and the sides of the gate 4. More specifically, amorphous silicon films are formed before implanting P-type impurity ions in the diffusion layer regions 15, 15 and then recrystallized into the recrystallized silicon films 8 to form a shallow p-type diffusion layer region, thereby contributing to contact resistance reduction and stabilization of the diffusion layer region 15.

Second Embodiment of Fabrication Method: FIGS. 17 to 31

The method of fabricating the second embodiment of the semiconductor device according to the invention, i.e., the method of fabricating the semiconductor devices shown in FIGS. 17 and 18, will now be explained with reference to the sectional views of FIGS. 19 to 31 and FIGS. 17 and 18. Portions in FIGS. 19 to 31 corresponding to those in FIGS. 2 to 16 are assigned the same reference symbols as those in FIGS. 2 to 16.

Since the method of fabricating the semiconductor devices explained in the following relates to transistors of P-type conductivity, only field effect transistors of P-type conductivity are taken up in the drawings and explanation.

The silicon substrate used in the case of the semiconductor device shown FIG. 17 is an N-type single crystalline silicon substrate 1. That used in the case of the semiconductor device shown in FIG. 18 is a single crystalline silicon substrate 11 formed with a conductivity type region 1w of N-type conductivity called an N-well, formed by ion implantation and annealing. Since in either case, the semiconductor device uses the N-type conductivity region of the single crystalline silicon substrate 1 or 1', the following explanation of the processing steps will be based on use of the single crystalline silicon substrate 1.

Figure 19:
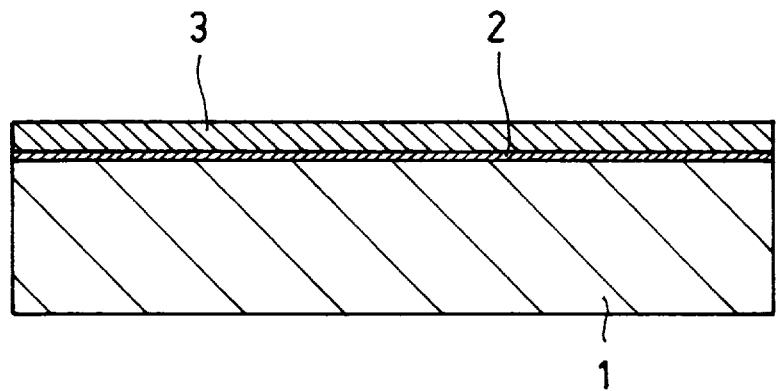
FIGS. 19 to 31 are sectional views showing processing steps for explaining the method of the invention for fabricating the semiconductor device shown in FIG. 17.

The single crystalline silicon substrate 1 of N-type is subjected to oxidation at 1000° C. in mixed oxygen and nitrogen gas using a thermal oxidation furnace to form a 10 nm gate oxide film 2 on the surface of the single crystalline silicon substrate 1, as shown in FIG. 19.

Next, a polysilicon film 3 for constituting the gate 4 is formed with a chemical vapor deposition (CVD) system using monosilane gas ($SiH_4$) as the reactive gas at 610° C., 0.3 Torr.

Figure 20:
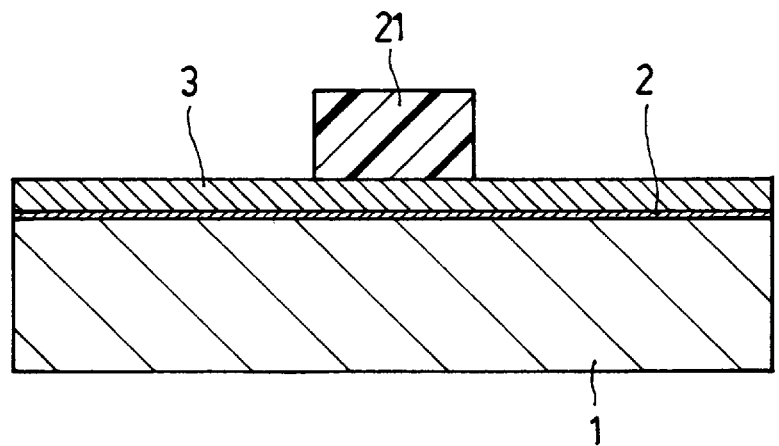
Figure 21:
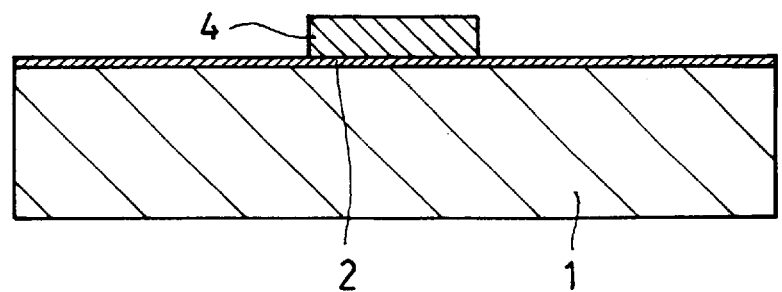

A photolithography is then used to form a photoresist 21 covering only the region to become the gate 4, as shown in FIG. 20. Using the photoresist 21 as an etching mask, the polysilicon film 3 is then etched with a mixed gas of $Cl_2+SF_6+CH_2F_2$ using ECR (electron cyclotron resonance) plasma to form the gate 4, as shown in FIG. 21.

Figure 22:
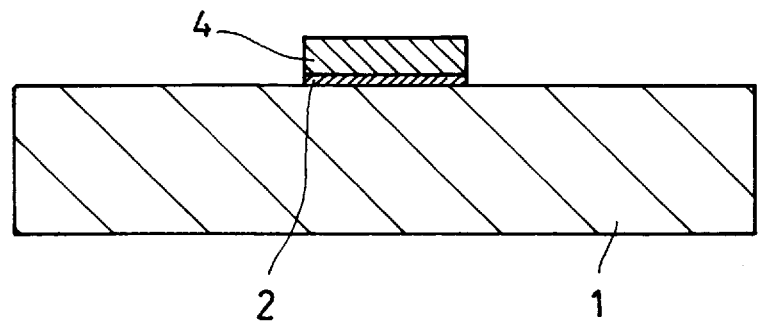

The gate oxide film 2 except for that under the gate 4 is removed by hydrofluoric acid, as shown in FIG. 22.

Figure 23:
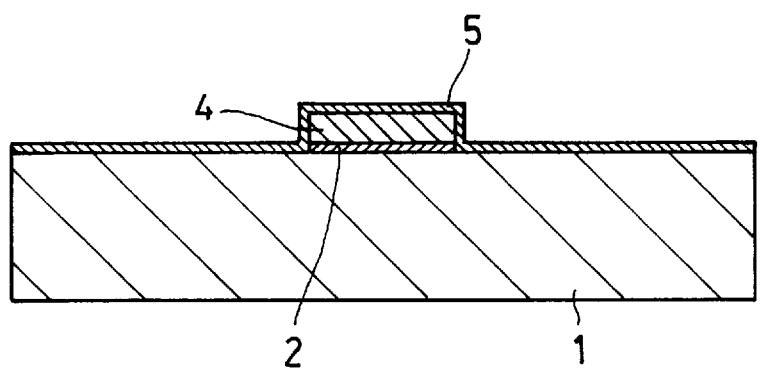

The result is subjected to oxidation at 1000° C. in an atmosphere of mixed oxygen and nitrogen gas using a thermal oxidation furnace to form a 5 nm first mask oxide film 5 over the whole surface of the single crystalline silicon substrate 1 including the surface of the gate 4, as shown in FIG. 23.

Figure 24:
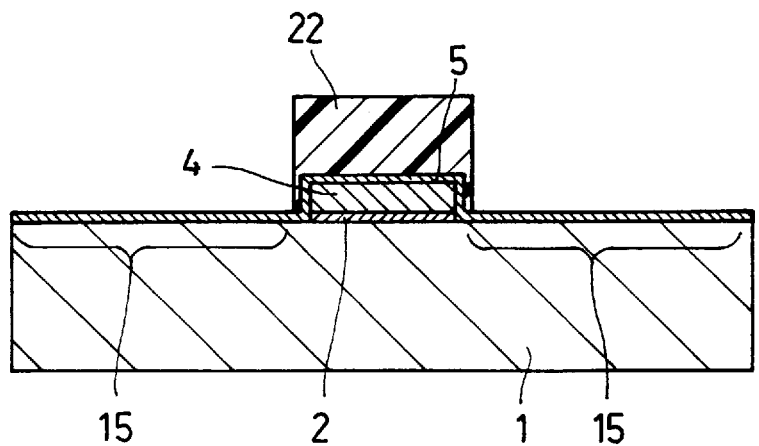

A photolithography is used to form a photoresist 22 so as to leave the first mask oxide film 5 on the diffusion layer regions 15, 15 exposed, as shown in FIG. 24.

Figure 25:
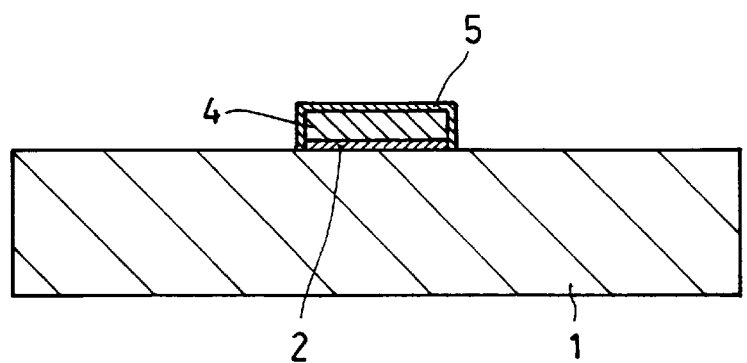

Using the photoresist 22 as an etching mask, the first mask oxide film 5 on the diffusion layer regions 15, 15 are removed by etching using a hydrofluoric acid system aqueous solution, as shown in FIG. 25.

Using a low-pressure CVD system, the surfaces of the diffusion layer regions 15, 15 of the single crystalline silicon substrate 1 are subjected to cleaning for about 10 min in a gas phase, e.g. hydrogen atmosphere, at a temperature of about 950° C., thereby removing the natural oxide film therefrom.

The cleaning of the surfaces of the diffusion layer regions 15, 15 by use of a low-pressure CVD system can otherwise be conducted by evacuating the vacuum pump of about $1\times10^{-5}$ Torr, introducing a mixed gas of chlorine and hydrogen, and maintaining a pressure of 0.3 Torr and a temperature of 570° C. for about 10 min.

Figure 26:
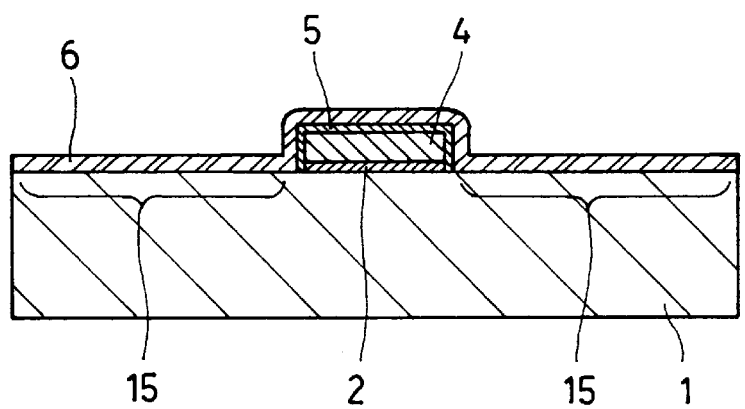

Continuously following this cleaning, the same low-pressure CVD system is evacuated to a vacuum pressure of about $1\times10^{-5}$ Torr and monosilane gas (SiH$_4$) at a temperature of 570° C. and a pressure of 0.3 Torr is used as a reactive gas for forming an amorphous silicon film 6 over the whole surface to a thickness of 150 nm, as shown in FIG. 26.

The amorphous silicon film 6 is next subjected to ion implantation using boron fluoride ($^{49}$BF$_2^+$) as P-type impurity ions, at an implantation energy of 25 keV and a dose of $1\times10^{15}$ atoms/cm$^2$. During this ion implantation, fluorine ions are also incorporated into the amorphous silicon film 6 subjected to the ion implantation.

The implantation energy during the ion implantation is controlled to implant the impurity ions only in the amorphous silicon film 6 and not in the diffusion layer regions 15, 15 of the single crystalline silicon substrate 1.

When boron ($^{11}$B$^+$) is used as the P-type impurity ions during ion implantation, the boron ions can be implanted in the amorphous silicon film 6 by forming the amorphous silicon film 6 to a thickness of 200 nm and setting the P-type impurity ion implantation energy to 25 keV.

Next, annealing is conducted for two hours at 570° C. in an atmosphere of inert gas (nitrogen or argon) passed at a flow rate of 2000 cc/min to recrystallize the amorphous silicon film 6.

The bond distances and bond angles between the silicon atoms of the amorphous silicon film 6 before annealing are in a disrupted state, while the diffusion layer regions 15, 15 of the single crystalline silicon substrate 1 have the atomic arrangement of a crystal. When the annealing is conducted at this low temperature, the amorphous silicon film 6 uses the surfaces of the diffusion layer regions 15, 15 as seed crystals to grow into a continuous crystal film by shifting and realignment of grains at the interface between the amorphous silicon films 8 and the diffusion layer regions 15, 15.

Figure 27:
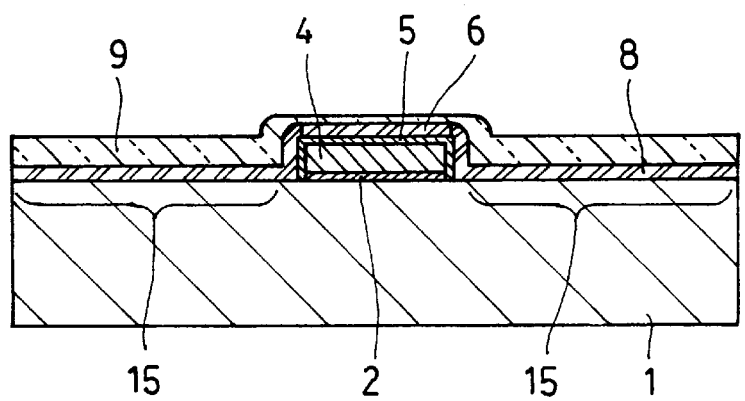

As a result, the amorphous silicon film 6 on the diffusion layer regions 15, 15 and the sides of the gate 4 converts into a single crystal silicon film to become the recrystallized silicon films 8, as shown in FIG. 27.

The first mask oxide film 5 is present on top of the gate 4 at the time of this recrystallization and the amorphous silicon film 6 is formed on the first mask oxide film 5. The amorphous silicon film 6 on top of the gate 4 is therefore not converted into a single crystalline silicon film.

The spin coating method is used to form a coated insulator film 9 of spin-on glass (SOG) over the whole surface, as shown in FIG. 27. Spin-on glass, a phosphorous glass dissolved in a solvent, can be easily applied at room temperature. Owing to the fluidity of the spin-on glass, the thickness of the coated insulator film 9 becomes thinner on the gate 4 than on the diffusion layer regions 15, 15, as can be seen in FIG. 27.

Figure 28:
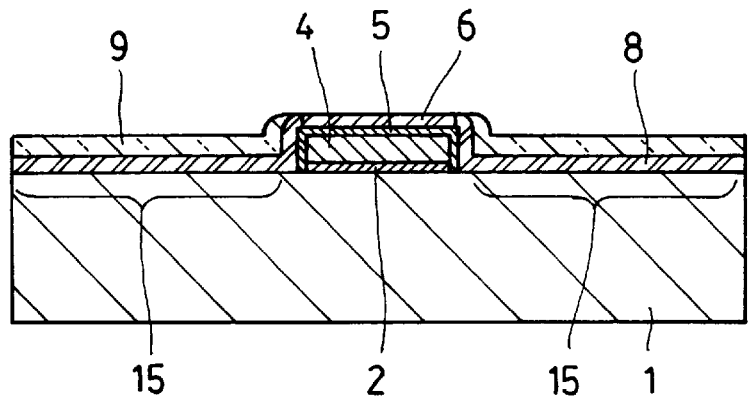

As shown in FIG. 28, the coated insulator film 9 on top of the gate 4 is removed by dry etching to expose the surface of the amorphous silicon film 6 on the gate 4.

Figure 29:
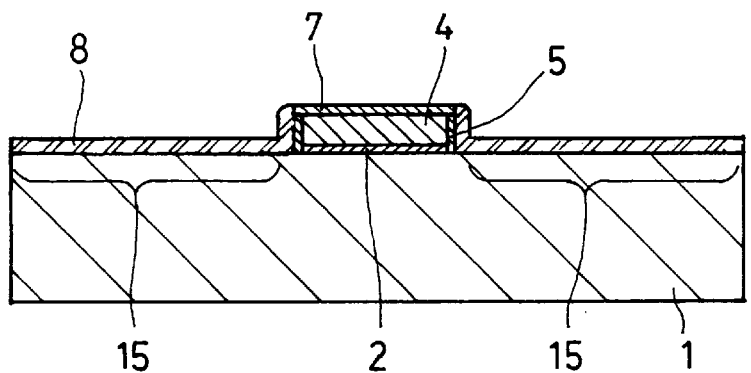

As shown in FIG. 29, the amorphous silicon film 6 on top of the gate 4 is removed by etching with a mixed hydrofluoric acid and nitric acid using the coated insulator film 9 remaining on the diffusion layer regions 15, 15 as an etching mask. The coated insulator film 9 on the diffusion layer regions 15, 15 is then removed by etching using a hydrofluoric acid.

Since the impurity contained in the spin-on glass (SOG) is of the opposite conductivity type from the P-type transistor, the coated insulator film 9 made of the spin-on glass is removed from the diffusion layer regions 15, 15 by etching so as to prevent the impurity from diffusing into, and altering the characteristics of, the transistor device.

When the coated insulator film 9 is removed by etching, the first mask oxide film 5 on the gate 4 is also removed. As shown in FIG. 29, therefore, a 5 nm second mask oxide film 7 is formed on top of the gate 4 under the same oxidation conditions as used to form the first mask oxide film 5.

Although the second mask oxide film is also formed on the recrystallized silicon films 8 on the diffusion layer regions 15, 15 at this time, only the second mask oxide film 7 on the gate 4 is shown in the drawings.

The formation of the second mask oxide film 7 prevents impurities contained in the interlayer insulator film 10 to be formed in a later step from diffusing through the gate 4 to the gate oxide film 2 and altering the device characteristics.

The removal of the amorphous silicon film 6 from the top of the gate 4 can instead be effected by using a photolithography process to coat all but the top of the gate 4 with a photoresist, followed by etching with a mixed hydrofluoric acid and nitric acid. In this case, since the first mask oxide film 5 is not removed, the second mask oxide film 7 need not be formed.

Figure 30:
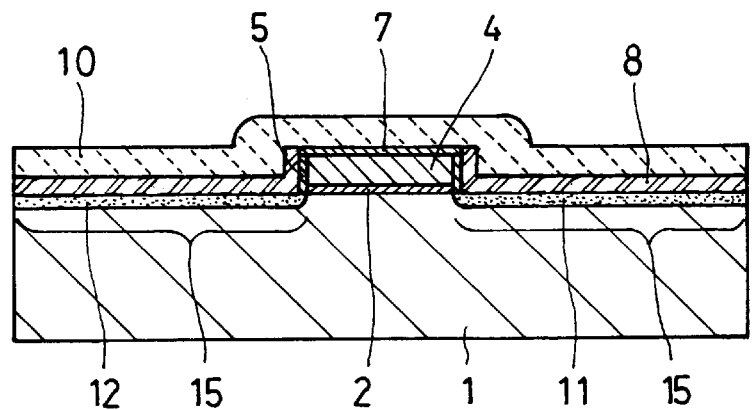

Next, a CVD method is carried out at 460° C. to form an interlayer insulator film 10 consisting of a silicon oxide film containing phosphorous (P) and boron (B) (BPSG) to a thickness of 550 nm, as shown in FIG. 30.

Annealing is then conducted in a nitrogen atmosphere at 925° C. for 10 min. This annealing causes the P-type impurity ions in the recrystallized silicon films 8 converted from the amorphous silicon film 6 to diffuse into the diffusion layer regions 15, 15 of the single crystalline silicon substrate 1. The impurity ions are activated simultaneously with this diffusion, thereby forming the source 11 and the drain 12 of the field effect transistor.

The fluorine ions incorporated during ion implantation of the source 11 and the drain 12 can be diffused outwardly from the single crystalline silicon substrate 1 and eliminated by annealing at 925° C. in an inert gas.

Figure 31:
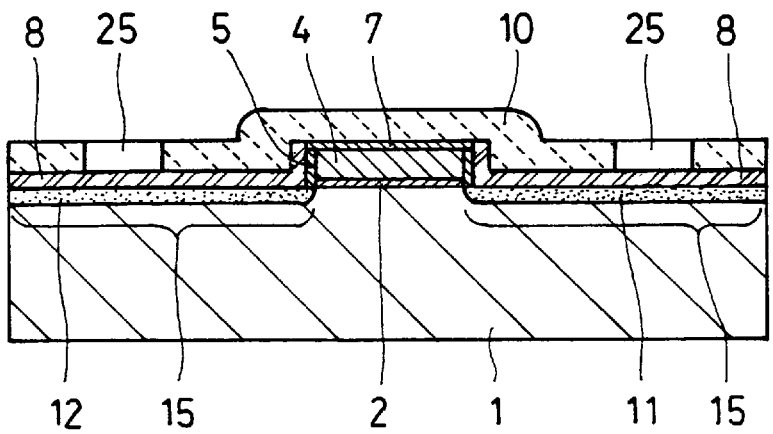

Contact holes 25, 25 are then formed in the interlayer insulator film 10 to open at locations corresponding to the source 11 and the drain 12, as shown in FIG. 31.

Interconnections 13, 13 made of aluminum alloy are connected to the source 11 and the drain 12 through the contact holes 25, 25. This completes the semiconductor device shown in FIG. 17 or 18.

Although formation of a shallow diffusion layer increases contact resistance, in the semiconductor device structure and fabrication method of this invention, the amorphous silicon film 6 on the diffusion layer regions 15, 15 is converted by annealing at 570° C. to the recrystallized silicon films 8, which remain as single crystal silicon films. The contact resistance with the aluminum interconnections 13, 13 can therefore be kept low. Because of this, no processing step is required after contact hole formation for lowering resistance such as by implanting P-type impurity ions in the contact hole regions.

The amorphous silicon film 6 need not be formed by the aforesaid CVD method but can instead be formed by, for example, a sputtering method using a silicon target. In such case, however, the top of the diffusion layer regions 15, 15 must be cleaned before formation of the amorphous silicon film 6.

Figure 32:
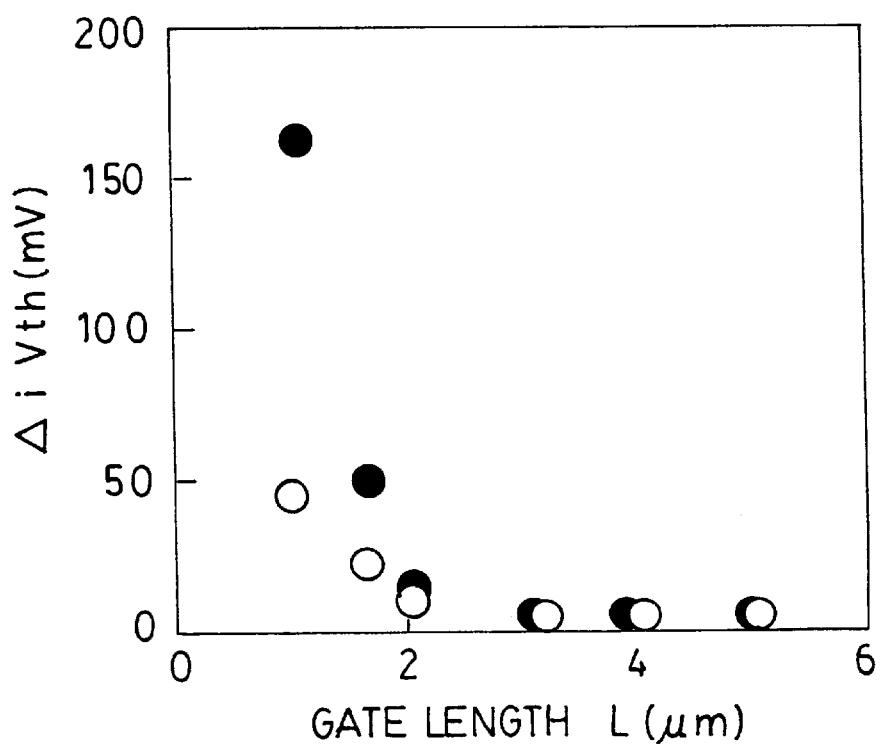
FIG. 32 is a graph showing how transistor threshold voltage shift varies as a function of physical gate length in the invention semiconductor device and a prior-art semiconductor device.
Figure 33:
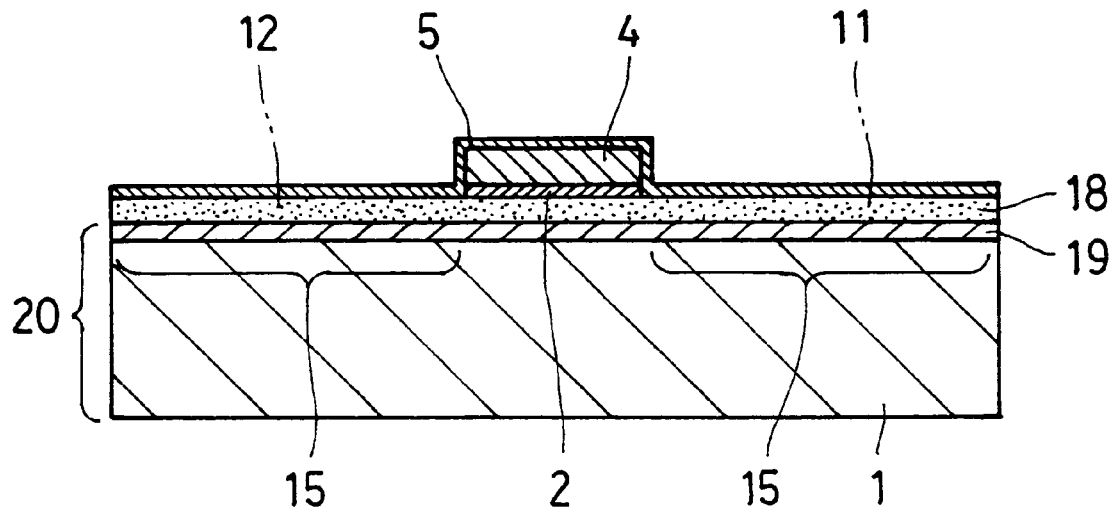
FIG. 33 is a sectional view for explaining an example of a prior-art semiconductor device structure and the method of fabricating the same.
Figure 34:
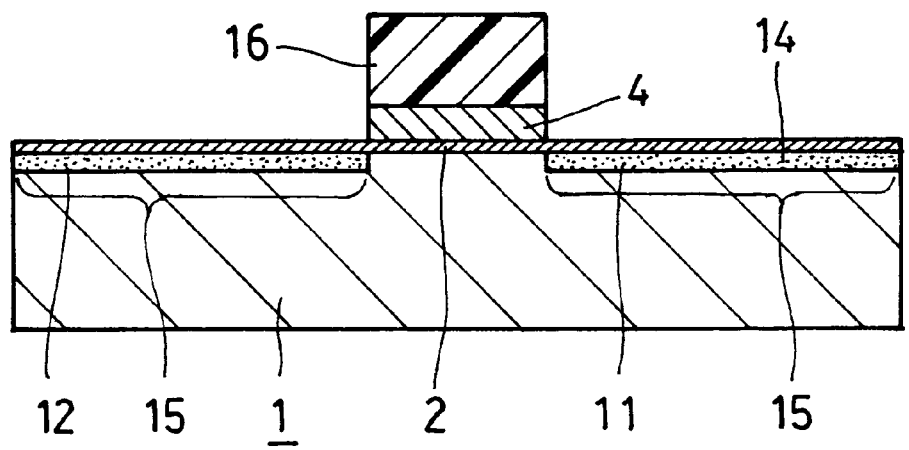
FIG. 34 is a sectional view for explaining another example of a prior-art semiconductor device structure and the method of fabricating the same.

FIG. 32 is a graph showing a characteristic comparison between a P-type transistor fabricated by the prior-art method of forming the gate 4, next forming the first mask oxide film 5 and then implanting P-type impurity ions and a P-type transistor fabricated by the method of this invention. The implantation conditions were the same in the invention method and the prior-art method.

In FIG. 32, the horizontal axis represents physical gate length L ($\mu$m) and the vertical axis represents $\Delta i$Vth (mV), namely, P-type transistor threshold voltage shift.

Threshold voltage shift was plotted taking the threshold voltage at a transistor gate length of 40 $\mu$m as a reference value. The threshold voltage at a gate length of 40 $\mu$m was 0.4 V for a gate width of 10 $\mu$m and a drain voltage of 2 V. The solid circles (●) in FIG. 32 are the plots obtained for the prior art and the hollow circles (○) are those obtained for the invention.

The same ion implantation conditions were used in the invention and the prior art. Specifically, boron fluoride ions ($^{49}BF_2^+$) were implanted at an implantation energy of 25 keV and a dose of $3 \times 10^{15}$ atoms/cm$^2$.

As can be seen from FIG. 32, in the semiconductor device of the invention, the short-channel effect (shortening of effective gate length) of the threshold voltage shifting markedly toward the depression side with decreasing gate length was suppressed relative to that in the prior-art semiconductor device.

The diffusion depth of the impurity diffused in the single crystalline silicon substrate 1 was 0.09 $\mu$m in the semiconductor device according to the invention and 0.20 $\mu$m in the prior-art semiconductor device. Because of this, lateral diffusion, the gate length direction, was suppressed in the transistor of the invention semiconductor device to enable suppression of the short-channel effect.

The well region and the diffusion layer region formed on the single crystalline silicon substrate form a pn junction from the structural aspect owing to their opposite conductivity types. The leak current through this pn junction was on the order of $1 \times 10^{-14}$ A (ampere), at the measurement limit of the measuring instrument.

In the semiconductor device of this invention, the source 11 and the drain 12 formed in the diffusion layer regions 15, 15 exhibited favorably low contact resistance.

EFFECT OF THE INVENTION

As explained in the foregoing, in accordance with the semiconductor device structure and fabrication method of this invention, an amorphous silicon film is formed before implanting impurity ions in the diffusion layer region of a field effect transistor formed on a thin-film SOI structure or before implanting impurity ions of P-type conductivity in the diffusion layer region of a field effect transistor formed on a single crystalline silicon substrate of N-type conductivity or having an N-type conductivity region.

After implantation of the impurity ions in the amorphous silicon film, low-temperature annealing is conducted to recrystallize the amorphous silicon film on the diffusion layer region and the sides of the gate and convert it to recrystallized silicon films which are single crystal silicon films.

By this, the diffusion layer region of the field effect transistor formed on a thin-film SOI structure in the semiconductor device of this invention enables formation of diffusion layers free of lattice defects and dislocation since impurity is diffused to the active region side from the amorphous silicon film.

Moreover, since the amorphous silicon film is formed before implanting P-type impurity in the diffusion layer region of a microstructure P-type field effect transistor formed on a single crystalline silicon substrate of N-type conductivity or having an N-type conductivity region, channeling, the phenomenon of deep penetration of the ions into the crystal without significant scattering, does not occur. A shallow diffusion layer can therefore be formed.

The semiconductor device of this invention is further able to avoid damage owing to the implantation of ions into the single crystalline silicon substrate. From the point of the characteristics of the field effect transistor, therefore, no increase in leak current is observed.

In addition, the semiconductor device of this invention enables securement of low contact resistance without need to subject the source and drain regions to special processing for lowering the contact resistance.

Thus, in accordance with the semiconductor device and the method of fabricating the same according to this invention, a field effect transistor having a thin-film SOI structure suitable for reducing feature size and a P-type field effect transistor formed on a single crystalline silicon substrate of N-type conductivity or having an N-type conductivity region can be formed without forming crystal defects in the diffusion layer region by ion implantation and also without increasing the contact resistance of the diffusion layer region.

What is claimed is:

1. A semiconductor device comprising:
   a gate oxide film formed on an SOI (silicon-on-insulator) substrate,
   a gate formed on the gate oxide film,
   a mask oxide film formed on sides and a top surface of the gate,
   recrystallized silicon films consisting of single crystalline silicon formed on the mask oxide film at the sides of the gate and on the SOI substrate at diffusion layer regions which become a source and a drain on opposite sides of the gate, and
   the source and the drain formed on opposite sides of the gate by the recrystallized silicon films of the diffusion layer regions and impurity ions diffused in the recrystallized silicon films.

2. The semiconductor device according to claim 1, wherein the SOI substrate is a SIMOX (separation-by-implantation-of-oxygen) substrate having a buried oxide film buried in a single crystalline silicon substrate.

3. A semiconductor device comprising:
   a gate oxide film formed on a N-type conductivity region of a single crystalline silicon substrate,
   a gate formed on the gate oxide film,
   a mask oxide film formed on sides and a top surface of the gate,
   recrystallized silicon films formed on the mask oxide film at the sides of the gate and on the N-type conductivity region of the single crystalline silicon substrate at diffusion layer regions which become a source and a drain on opposite sides of the gate, and
   the source and the drain formed on opposite sides of the gate by the recrystallized silicon films of the diffusion layer regions and P-type impurity ions diffused in the recrystallized silicon films.

* * * * *